United States Patent
Noguchi et al.

(10) Patent No.: US 11,753,740 B2
(45) Date of Patent: Sep. 12, 2023

(54) DIAMOND SUBSTRATE AND METHOD FOR MANUFACTURING THE SAME

(71) Applicants: SHIN-ETSU CHEMICAL CO., LTD., Tokyo (JP); NATIONAL UNIVERSITY CORPORATION KANAZAWA UNIVERSITY, Kanazawa (JP)

(72) Inventors: Hitoshi Noguchi, Takasaki (JP); Norio Tokuda, Kanazawa (JP); Tsubasa Matsumoto, Kanazawa (JP)

(73) Assignees: SHIN-ETSU CHEMICAL CO., LTD., Tokyo (JP); NATIONAL UNIVERSITY CORPORATION KANAZAWA UNIVERSITY, Kanazawa (JP)

( * ) Notice: Subject to any disclaimer, the term of this patent is extended or adjusted under 35 U.S.C. 154(b) by 23 days.

(21) Appl. No.: 17/099,229

(22) Filed: Nov. 16, 2020

(65) Prior Publication Data
US 2021/0148005 A1    May 20, 2021

(30) Foreign Application Priority Data

Nov. 18, 2019    (JP) ................ 2019-208258
Dec. 23, 2019    (JP) ................ 2019-232061

(51) Int. Cl.
   *C30B 29/04*    (2006.01)
   *C23C 16/02*    (2006.01)
   *C23C 16/27*    (2006.01)
   *C30B 25/18*    (2006.01)
   (Continued)

(52) U.S. Cl.
   CPC .......... *C30B 29/04* (2013.01); *C23C 16/0281* (2013.01); *C23C 16/277* (2013.01);
   (Continued)

(58) Field of Classification Search
   CPC ................. C01B 32/25; C30B 29/04
   (Continued)

(56) References Cited

U.S. PATENT DOCUMENTS

2005/0011433 A1*   1/2005   Hemley ............... C23C 16/277
                                                                          117/68
2006/0065187 A1*   3/2006   Hemley ............... C30B 25/105
                                                                          117/104

(Continued)

OTHER PUBLICATIONS

May 4, 2021 Search Report issued in European Patent Application No. 20208454.7.

(Continued)

*Primary Examiner* — Seth Dumbris
(74) *Attorney, Agent, or Firm* — Oliff PLC

(57) ABSTRACT

A method for manufacturing diamond substrate of using source gas containing hydrocarbon gas and hydrogen gas to form diamond crystal on an underlying substrate by CVD method, to form a diamond crystal layer having nitrogen-vacancy centers in at least part of the diamond crystal, nitrogen or nitride gas is mixed in the source gas, wherein the source gas is: 0.005 volume % or more and 6.000 volume % or less of the hydrocarbon gas; 93.500 volume % or more and less than 99.995 volume % of the hydrogen gas; and $5.0 \times 10^{-5}$ volume % or more and $5.0 \times 10^{-1}$ volume % or less of the nitrogen gas or the nitride gas, and the diamond crystal layer having the nitrogen-vacancy centers is formed. A method for manufacturing a diamond substrate to form an underlying substrate, a diamond crystal having a dense nitrogen-vacancy centers (NVCs) with an orientation of NV axis by performing the CVD.

4 Claims, 1 Drawing Sheet

(51) Int. Cl.
*H01F 1/40* (2006.01)
*C30B 25/20* (2006.01)
*H01F 10/10* (2006.01)
*C01B 32/25* (2017.01)

(52) U.S. Cl.
CPC ............ *C23C 16/279* (2013.01); *C30B 25/18* (2013.01); *C30B 25/183* (2013.01); *C30B 25/20* (2013.01); *H01F 1/40* (2013.01); *C01B 32/25* (2017.08); *H01F 10/10* (2013.01); *Y10T 428/30* (2015.01)

(58) Field of Classification Search
USPC .......................................................... 428/408
See application file for complete search history.

(56) References Cited

U.S. PATENT DOCUMENTS

| | | | |
|---|---|---|---|
| 2010/0126406 A1* | 5/2010 | Yan | C30B 25/14 |
| | | | 117/103 |
| 2013/0143022 A1 | 6/2013 | Schreck et al. | |
| 2014/0335339 A1 | 11/2014 | Dhillon et al. | |
| 2017/0373153 A1* | 12/2017 | Narayan | C30B 13/06 |
| 2018/0067056 A1* | 3/2018 | Simic | G09F 3/02 |
| 2018/0087183 A1* | 3/2018 | Misra | C30B 25/105 |
| 2019/0211473 A1 | 7/2019 | Twitchen et al. | |

OTHER PUBLICATIONS

Hatano et al.; "Diamond Semiconductor Devices for Next Generation Power Electronics and Quantum Sensing Applications"; OYOBUTURI; 2016; vol. 85; No. 4; pp. 311-316, 326.

Fukui et al.; "Perfect Selection Alignment of Nitrogen-Vacancy Centers in Diamond"; Applied Physics Express 7, 055201; 2014; pp. 1-4.

Ozawa et al.; "Diamond Growth for Fabrication of Ensemble NV Centers"; NDF Dia.Symp.29, 16; 2015; pp. 1-11.

Feb. 24, 2023 Office Action issued in European Patent Application No. 20208454.7.

* cited by examiner

[FIG. 1]
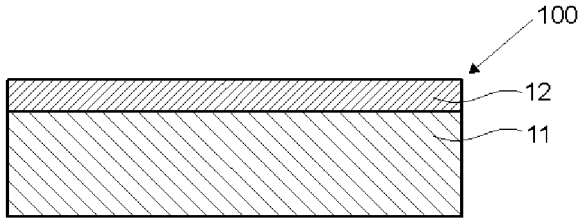
[FIG. 2]
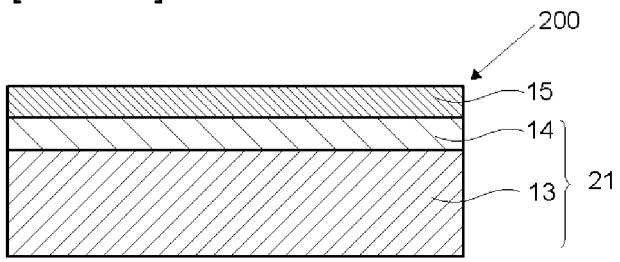
[FIG. 3]
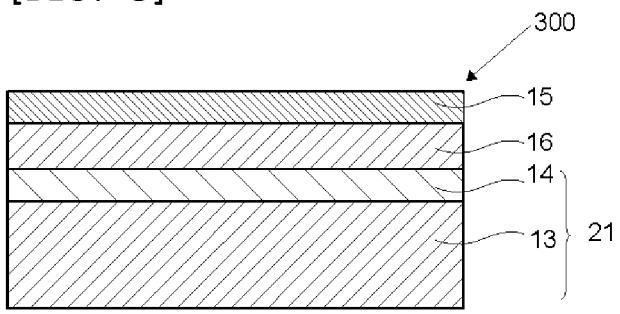
[FIG. 4]
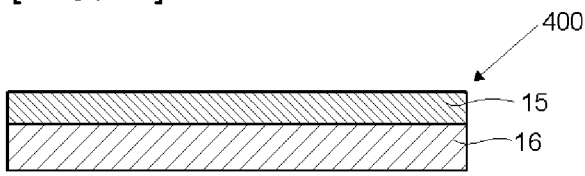
[FIG. 5]
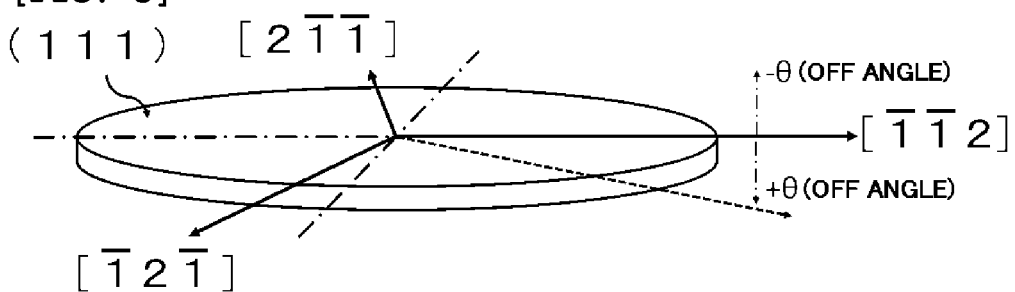

DIAMOND SUBSTRATE AND METHOD FOR MANUFACTURING THE SAME

TECHNICAL FIELD

The present invention relates to a diamond substrate and a method for manufacturing the same.

BACKGROUND ART

Diamond has a wide band gap of 5.47 eV at room temperature, and is known as a wide bandgap semiconductor.

Among wide bandgap semiconductors, diamond has extremely high dielectric breakdown electric field strength of 10 MV/cm, and a high-voltage operation can be performed. In addition, diamond has the highest thermal conductivity among known materials, and has an excellent heat radiation property thereby. Further, diamond has very large carrier mobility and saturated drift velocity, and is suitable for a high speed device.

Accordingly, diamond has the highest Johnson performance index, which indicates a property as a radio-frequency and high power device, compared to semiconductors such as silicon carbide and gallium nitride, and is said to be an ultimate semiconductor thereby.

Further, diamond has a phenomenon of nitrogen-vacancy center (NVC) within the crystal, and can manipulate and detect a single spin in room temperature, and has the characteristic that the condition can be imaged by photo detection magnetic resonance. Making use of this characteristic, application in a wide field of high-sensitivity sensors for magnetic field, electric field, temperature, and pressure, etc. is expected.

CITATION LIST

Non Patent Literature

Non Patent Document 1: M. Hatano et al., OYOBUTURI 85, 311 (2016).
Non Patent Document 2: T. Fukui, et al., APEX 7,055201 (2014).
Non Patent Document 3: H. Ozawa, et al., NDF Dia. Symp. 29, 16 (2015).

PATENT LITERATURE

Patent Document 1: US 2013/0143022 A1

SUMMARY OF INVENTION

Technical Problem

As described above, diamond is expected to be used practically as material for semiconductors or material for electronic and magnetic devices, and supply of a diamond substrate with a large area and high quality is desired. For example, in Patent Document 1, a technology to form a diamond (111) crystal by heteroepitaxial growth using a chemical vapor deposition method is reported. In particular, for use in an NVC device, having high importance among uses for diamond, the nitrogen-vacancy axis (NV axis) has to be highly oriented, and therefore, the diamond surface is preferably a (111) crystal surface with the NV axis aligned in a [111] direction (Non Patent Document 1). In addition, for example, considering application in an MRI field for medical purposes, a device that can measure a wider range efficiently can be realized with a diamond substrate that has a large diameter as the magnetic sensor portion. In addition, there is also an advantage considering manufacturing costs.

In addition, when the diamond substrate is used for electronic and magnetic devices, the sensor portion not only needs to have the NV axis aligned in a [111] direction in the diamond crystal, but also needs to be formed with high density.

Fabrication of a highly-dense-NVC-formed diamond crystal having a [111] orientation that has been reported until now is as follows.

Using a single crystal diamond synthesized by a High Pressure and High Temperature (HPHT) method as an underlying substrate and growing a diamond crystal by a microwave plasma chemical vapor deposition (CVD) method by adding nitrogen to hydrogen-diluted methane is considered (Non Patent Documents 2 and 3).

However, in the reported documents, only HPHT Ib (111), which is practically difficult to obtain in large sizes, is used as a base substrate, and furthermore, in Non Patent Document 2, details of the gas composition in the CVD are unclear. In addition, in Non Patent Document 3, it is unclear whether the CVD conditions in the document have been optimized.

The present invention has been made to solve the above problems, and an object thereof is to provide a method for manufacturing a diamond substrate that makes it possible to form, on an underlying substrate, a diamond crystal that has highly dense nitrogen-vacancy centers (NVCs) with a high [111] orientation of NV axis by performing the CVD under specified conditions. In addition, an object of the present invention is also to provide such a diamond substrate.

Solution to Problem

The present invention has been made to achieve the object, and provides a method for manufacturing a diamond substrate of using a source gas containing a hydrogen gas, being a dilution gas, and a hydrocarbon gas to form a diamond crystal on an underlying substrate by any CVD method out of a microwave plasma CVD method, a direct current plasma CVD method, a hot-filament CVD method, and an arc discharge plasma jet CVD method, wherein to form a diamond crystal layer having nitrogen-vacancy centers in at least a part of the diamond crystal to be formed on the underlying substrate, a nitrogen gas or a nitride gas is mixed in the source gas, and an amount of each gas contained in the source gas is:

0.005 volume % or more and 6.000 volume % or less of the hydrocarbon gas;

93.500 volume % or more and less than 99.995 volume % of the hydrogen gas; and $5.0 \times 10^{-3}$ volume % or more and $5.0 \times 10^{-1}$ volume % or less of the nitrogen gas or the nitride gas, and the diamond crystal layer having the nitrogen-vacancy centers is formed.

A method for manufacturing a diamond substrate with such CVD conditions makes it possible to manufacture a diamond substrate with a diamond crystal layer formed, the diamond crystal layer having high crystallinity and highly dense NVCs with a high [111] orientation of NV axis. Such a diamond crystal can be suitably used for electronic and magnetic devices.

In this event, a methane gas can be used as the hydrocarbon gas, a nitrogen gas can be used as the nitrogen gas or the nitride gas mixed in the source gas, and the amount of each gas contained in the source gas can be:

0.1 volume % or more and 6.000 volume % or less of the methane gas;

93.500 volume % or more and less than 99.900 volume % of the hydrogen gas; and $5.0 \times 10^{-5}$ volume % or more and $5.0 \times 10^{-1}$ volume % or less of the nitrogen gas.

A method for manufacturing a diamond substrate with such CVD conditions makes it possible to more effectively manufacture a diamond substrate with a diamond crystal layer formed, the diamond crystal layer having high crystallinity and highly dense NVCs with a high [111] orientation of NV axis.

In this event, a gas pressure in the formation of the diamond crystal by the CVD method can be 1.3 kPa (10 Torr) or more and 50.0 kPa (376 Torr) or less.

Furthermore, a gas pressure in the formation of the diamond crystal by the CVD method can be 12.0 kPa (90 Torr) or more and 33.3 kPa (250 Torr) or less.

Under such gas pressure conditions, growth of non-single crystal diamond can be suppressed more effectively, and a single crystal diamond having high crystallinity can be obtained.

Furthermore, a discharge power density in the formation of the diamond crystal by the CVD method can be 188 W/cm$^2$ or more and 942 W/cm$^2$ or less.

Under such discharge power density conditions, growth of non-single crystal diamond can be suppressed more effectively, and a single crystal diamond having high crystallinity can be obtained.

Furthermore, a discharge current density in the formation of the diamond crystal by the CVD method can be 0.09 A/cm$^2$ or more and 0.85 A/cm$^2$ or less.

Under such discharge current density conditions, growth of non-single crystal diamond can be suppressed more effectively, and a single crystal diamond having high crystallinity can be obtained.

Furthermore, in the inventive method for manufacturing a diamond substrate, the underlying substrate can be a single layer substrate of a single crystal diamond.

When a single crystal diamond is adopted as the underlying substrate in this manner, the NV axes of an NVC-containing diamond crystal can be formed to be highly [111]-oriented and highly dense more effectively.

In this event, the single layer substrate of a single crystal diamond is preferably a single crystal diamond (111) having a main surface having an off angle within a range, −8.0° or more and −0.5° or less, or +0.5° or more and +8.0° or less in a crystal axis [−1−1 2] direction or a threefold symmetry direction thereof relative to a crystal plane orientation of (111).

When such a single crystal diamond (111) is used as the underlying substrate, step-flow growth can be easily performed, and a high-quality single crystal diamond with fewer hillocks, abnormal growth particles, and dislocation defects, etc. can be formed.

Furthermore, the single layer substrate of a single crystal diamond can be any of a high-pressure-high-temperature-synthesized single crystal diamond, a heteroepitaxial single crystal diamond, a CVD-synthesized homoepitaxial diamond, and a combined single crystal diamond thereof.

As the underlying substrate in the inventive method for manufacturing a diamond substrate, these single crystal diamonds can be suitably adopted.

Furthermore, in the inventive method for manufacturing a diamond substrate, the underlying substrate can have a laminated structure including an underlayer substrate and an intermediate layer on the underlayer substrate.

As the underlying substrate in the inventive method for manufacturing a diamond substrate, a substrate having such a laminated structure can also be adopted.

In this case, the intermediate layer can have an outermost surface being a metal layer selected from Ir, Rh, Pd, and Pt.

When the outermost surface of the intermediate layer is formed with such kinds of metal layer, diamond nuclei tend to have high density when a nucleation treatment (bias treatment) is performed, and the single crystal diamond layer is more easily formed thereon.

Furthermore, the underlayer substrate can be a substrate consisting of a single body of Si, MgO, Al$_2$O$_3$, SiO$_2$, Si$_3$N$_4$, or SiC, or a laminated body including a plurality of layers selected from Si, MgO, Al$_2$O$_3$, SiO$_2$, Si$_3$N$_4$, or SiC.

When these materials are used for the underlayer substrate, it is easy to set the crystal plane orientation (including the off angle) of the main surface of the underlying substrate along with the intermediate layer, and therefore, the materials are preferable as materials for the underlayer substrate of the underlying substrate.

Furthermore, the underlayer substrate can be Si (111) or a Si (111) layer can be further comprised between the underlayer substrate and the intermediate layer.

Such a constitution allows an epitaxial growth, advantageous for enlarging the area of a diamond substrate.

In this case, the Si (111) of the underlayer substrate or the Si (111) layer between the underlayer substrate and the intermediate layer can have a main surface having an off angle within a range, −8.0° or more and −0.5° or less, or +0.5° or more and +8.0° or less in a crystal axis [−1−1 2] direction or a threefold symmetry direction thereof relative to a crystal plane orientation of (111).

When the laminated structure of the underlying substrate is constituted in this manner, step-flow growth can be easily performed, and a high-quality single crystal diamond crystal with few hillocks, abnormal growth particles, and dislocation defects, etc. can be formed.

Furthermore, the underlayer substrate can be MgO (111) or a MgO (111) layer can be further comprised between the underlayer substrate and the intermediate layer.

Such a constitution allows an epitaxial growth, advantageous for enlarging the area of a diamond substrate.

In this event, the MgO (111) of the underlayer substrate or the MgO (111) layer between the underlayer substrate and the intermediate layer can have a main surface having an off angle within a range, −8.0° or more and −0.5° or less, or +0.5° or more and +8.0° or less in a crystal axis [−1−1 2] direction or a threefold symmetry direction thereof relative to a crystal plane orientation of (111).

When the laminated structure of the underlying substrate is constituted in this manner, step-flow growth can be easily performed, and a high-quality single crystal diamond crystal with few hillocks, abnormal growth particles, and dislocation defects, etc. can be formed. In addition, such MgO (111) has a lattice constant close to that of a diamond, and therefore, epitaxial growth of a high-quality diamond crystal becomes possible.

Furthermore, in the present invention, the method for manufacturing a diamond substrate can be performed so that a member containing Si is not used in a chamber for performing the formation of the diamond crystal by the CVD method.

In this manner, Si does not get mixed in the diamond crystal to be formed. Thus, when the manufactured diamond substrate is used as electric and magnetic devices, there is no influence of noise from silicon-vacancy centers, and high sensitivity can be achieved.

In this case, sapphire can be used for an observation window of the chamber.

In this manner, the state of the process during CVD can be visually observed without Si getting mixed into the diamond crystal to be formed, and it also becomes possible to check the temperature with a radiation thermometer, etc.

Furthermore, in the present invention, the underlying substrate can be removed from a diamond substrate including the diamond crystal layer having the nitrogen-vacancy centers obtained by the method for manufacturing a diamond substrate to obtain a freestanding single crystal diamond substrate including the diamond crystal layer having the nitrogen-vacancy centers.

In this manner, a freestanding single crystal diamond substrate including a diamond crystal layer having high crystallinity and highly dense NVCs with a high [111] orientation of NV axis can be obtained. This freestanding single crystal diamond substrate can be applied to electronic and magnetic devices.

Furthermore, in the present invention, it is also possible to smooth a surface of the diamond crystal layer having the nitrogen-vacancy centers of a diamond substrate including the diamond crystal layer having the nitrogen-vacancy centers obtained by the method for manufacturing a diamond substrate.

In this manner, irregular reflection of light on the surface of the diamond crystal layer having the NVCs is suppressed, and NV⁻ center light that can be obtained can be increased.

Furthermore, the present invention provides a diamond substrate including a diamond crystal layer having nitrogen-vacancy centers, wherein a light intensity $I_{NV-}$ of an NV center light (wavelength: 637 nm) is $I_{NV-} \geq 2800$ counts when the diamond crystal layer having the nitrogen-vacancy centers is measured by a photoluminescence apparatus under conditions: an excitation light wavelength of 532 nm; an excitation light intensity of 2.0 mW; a total time of 1 second; a total number of 3 times; a hole diameter of 100 μm; an objective lens with a magnification of 15; and measurement in room temperature of 298 K.

Such a diamond substrate has high crystallinity and highly dense NVCs with a high [111] orientation of NV axis. In addition, for this reason, the diamond substrate can be applied to electronic and magnetic devices.

In this case, a ratio $I_{NV-}/IRaman$ of a light intensity $I_{NV-}$ of an NV⁻ center light (wavelength: 637 nm) and a light intensity IRaman of a Raman scattered light (wavelength: 573 nm) is preferably $I_{NV-}/IRaman \geq 0.04$ when the diamond crystal layer having the nitrogen-vacancy centers is measured by the photoluminescence apparatus under conditions: an excitation light wavelength of 532 nm; an excitation light intensity of 2.0 mW; a total time of 1 second; a total number of 3 times; a hole diameter of 100 μm; an objective lens with a magnification of 15; and measurement in room temperature of 298 K.

Furthermore, a nitrogen concentration [N] in the diamond crystal layer having the nitrogen-vacancy centers is preferably $5\times10^{17}$ atoms/cm³ $\leq$[N]$\leq 9\times10^{19}$ atoms/cm³.

When the diamond substrate has such physical properties, the diamond substrate can have an NVC-containing diamond crystal with more favorable characteristics.

Furthermore, an average surface roughness Ra of a surface of the diamond crystal layer having the nitrogen-vacancy centers is preferably Ra$\leq$270 nm.

When the surface roughness is as described, irregular reflection of light on the surface of the diamond crystal layer having the NVCs is suppressed, and the NV⁻ center light that can be obtained can be increased.

Advantageous Effects of Invention

As described above, the inventive method for manufacturing a diamond substrate makes it possible to manufacture a diamond substrate with a diamond crystal layer formed, the diamond crystal layer having high crystallinity and highly dense NVCs with a high [111] orientation of NV axis. Such a diamond crystal can be suitably used for electronic and magnetic devices.

In addition, the inventive diamond substrate makes it possible to provide a diamond substrate that has high crystallinity and highly dense NVCs with a high [111] orientation of NV axis, and that can be applied to electronic and magnetic devices.

BRIEF DESCRIPTION OF DRAWINGS

FIG. 1 shows an example where an NVC-containing diamond is formed on a single layer underlying substrate according to the present invention.

FIG. 2 shows an example where an NVC-containing diamond is formed on a laminated underlying substrate according to the present invention.

FIG. 3 shows an example where a nitrogen-undoped diamond and an NVC-containing diamond are formed on a laminated underlying substrate according to the present invention.

FIG. 4 shows an example of a diamond substrate with the NVC-containing diamond layer/nitrogen-undoped diamond layer made to remain according to the present invention.

FIG. 5 is a schematic diagram explaining the plane orientation of a substrate.

DESCRIPTION OF EMBODIMENTS

Hereinafter, the present invention will be described in detail, but the present invention is not limited thereto.

As described above, it has been desired to obtain a diamond substrate that is suitable for electronic and magnetic devices and that has a large diameter, high crystallinity, and highly dense NVCs with a high [111] orientation of NV axis.

The present inventors have keenly studied the above problems and found out that a method for manufacturing a diamond substrate of using a source gas containing a hydrogen gas, being a dilution gas, and a hydrocarbon gas to form a diamond crystal on an underlying substrate by any CVD method out of a microwave plasma CVD method, a direct current plasma CVD method, a hot-filament CVD method, and an arc discharge plasma jet CVD method, wherein to form a diamond crystal layer having nitrogen-vacancy centers in at least a part of the diamond crystal to be formed on the underlying substrate, a nitrogen gas or a nitride gas is mixed in the source gas, and an amount of each gas contained in the source gas is:

0.005 volume % or more and 6.000 volume % or less of the hydrocarbon gas;

93.500 volume % or more and less than 99.995 volume % of the hydrogen gas; and $5.0 \times 10^{-5}$ volume % or more and $5.0 \times 10^{-1}$ volume % or less of the nitrogen gas or the nitride gas, and the diamond crystal layer having the nitrogen-vacancy centers is formed makes it possible to obtain a diamond substrate having high crystallinity and highly dense NVCs with a high [111] orientation of NV axis, and completed the present invention.

Regarding the source gas for forming a diamond crystal layer having NVCs, methane gas, acetylene, ethylene, ethane, propane, etc. can be used as the hydrocarbon gas, and methane gas is preferable, since a high-purity gas can be easily procured at low cost, and can be easily handled.

If the amount of the hydrocarbon gas such as methane gas is less than 0.005 volume %, the etching effect of hydrogen is increased, and it becomes difficult for diamond to grow. A more preferable range for the amount of the hydrocarbon gas is 0.01 volume % or more, further preferably 0.05 volume % or more, and most preferably 0.1 volume % or more. On the other hand, if the amount of the hydrocarbon gas exceeds 6.0 volume %, the diamond becomes polycrystallized if grown for a long time, and therefore, it is difficult to obtain a good quality single crystal. The amount of the hydrocarbon gas is more preferably 5.5 volume % or less, further preferably 5.0 volume % or less.

In addition, regarding this source gas, if the amount of the nitrogen gas or the nitride gas is less than $5.0 \times 10^{-5}$ volume %, the doped amount of nitrogen in the diamond crystal is too little, and NVC density also becomes lowered. A more preferable range for the nitrogen gas or the nitride gas is $5.0 \times 10^{-4}$ volume % or more, further preferably $1.0 \times 10^{-3}$ volume % or more. On the other hand, if the amount of this nitrogen gas or nitride gas exceeds $5.0 \times 10^{-1}$ volume %, the diamond becomes easily polycrystallized if grown for a long time, and therefore, it is difficult to obtain a good quality single crystal. A more preferable range for the amount of the nitrogen gas or the nitride gas is $1.0 \times 10^{-2}$ volume % or less. Ammonia, nitrogen oxide, nitrogen dioxide, etc. can be used as the nitride gas, and nitrogen gas is preferable, since a high-purity gas can be easily procured at low cost, and can be easily handled.

As described above, methane gas is preferably used as the hydrocarbon gas, and nitrogen gas is preferably used as the nitrogen gas or the nitride gas mixed in the source gas. In this case, the amount of each gas contained in the source gas is preferably: 0.1 volume % or more and 6.000 volume % or less of the methane gas; 93.500 volume % or more and less than 99.900 volume % of the hydrogen gas; and $5.0 \times 10^{-3}$ volume % or more and $5.0 \times 10^{-1}$ volume % or less of the nitrogen gas.

In this event, the gas pressure in the formation of the diamond crystal by each CVD method is preferably 1.3 kPa (10 Torr) or more and 50.0 kPa (376 Torr) or less, since this makes it possible to prevent the polycrystallization of the diamond effectively, and a good quality single crystal can be obtained. If the gas pressure is too low, it is difficult to generate a discharge, and plasma density is too low to obtain a good quality single crystal diamond. On the other hand, if the gas pressure is too high, problems such as the difficulty to generate a discharge, degradation of crystallinity due to high temperature, and further, reduction in the formation range of the diamond become liable to occur. A more preferable range for the gas pressure is 12.0 kPa (90 Torr) or more and 33.3 kPa (250 Torr) or less.

Furthermore, the growth of the diamond can be effectively progressed by raising the discharge power density in the formation of the diamond crystal by each CVD method. Therefore, the discharge power density is preferably 188 W/cm$^2$ or more and 942 W/cm$^2$ or less. This discharge power density is more preferably 210 W/cm$^2$ or more. If the discharge power density is too high, polycrystallization of the diamond becomes liable to occur if grown for a long time. Therefore, the discharge power density is more preferably 800 W/cm$^2$ or less. A good quality single crystal can be obtained in this manner.

Furthermore, the growth of the diamond can be effectively progressed by raising the discharge current density in the formation of the diamond crystal by each CVD method. Therefore, the discharge current density is preferably 0.09 A/cm$^2$ or more and 0.85 A/cm$^2$ or less. This discharge current density is more preferably 0.10 A/cm$^2$ or more. If the discharge current density is too high, polycrystallization of the diamond becomes liable to occur if grown for a long time. Therefore, the discharge current density is more preferably 0.70 A/cm$^2$ or less. A good quality single crystal can be obtained in this manner.

Hereinafter, the present invention will be described with reference to drawings. Firstly, terms used in the present description will be defined.

In the present description, a crystal layer and a crystal film whose main surfaces are (111) surfaces will be called simply "(111) layer" and "(111) film". For example, a single crystal diamond layer whose main surface is a (111) surface will be called "single crystal diamond (111) layer".

The idea of off angles is shown in FIG. 5. FIG. 5 shows a conceptual diagram of the [−1−1 2] direction and the threefold symmetry directions thereof, [−1 2−1] and [2−1−1] directions and the off angle of a substrate whose main surface is a (111) surface. Note that in the present description, the

[$\bar{1}\,\bar{1}\,2$]

direction will be noted as the [−1−1 2] direction. The same notation is used for the other directions, and the line marked above the number in the usual notation for Miller indices is substituted with a "−" before the number.

(Method for Manufacturing NVC-Containing Diamond Substrate)

As described above, CVD (chemical vapor deposition) methods for forming a diamond crystal on an underlying substrate in the present invention include a microwave plasma CVD method, a direct current plasma CVD method, a hot-filament CVD method, and an arc discharge plasma jet CVD method. In particular, a diamond obtained by the microwave plasma CVD method and the direct current plasma CVD method has high crystallinity, few hillocks, abnormal growth particles, and dislocation defects, and is a high-quality single crystal diamond with favorable impurity controllability.

To form NV axes with high [111] orientation and high density, the underlying substrate is preferably a single layer substrate of a single crystal diamond, and in particular, it is preferable to perform an epitaxial growth on the underlying substrate using a single crystal diamond (111). FIG. 1 shows a diamond substrate 100, having an NVC-containing diamond layer 12 formed on an underlying substrate 11. To explain with reference to FIG. 1, a single layer substrate of a single crystal diamond, in particular, a single crystal diamond (111) is preferably used as the underlying substrate 11.

Furthermore, in this case, the single crystal diamond (111) used as the underlying substrate 11 preferably has a main surface having an off angle within a range, −8.0° or more and −0.5° or less, or +0.5° or more and +8.0° or less in a crystal axis [−1−1 2] direction or a threefold symmetry direction thereof relative to a crystal plane orientation of (111). When such a single crystal diamond (111) is used as the underlying substrate 11, step-flow growth can be easily performed, and a high-quality single crystal diamond with fewer hillocks, abnormal growth particles, and dislocation defects, etc. can be formed.

Furthermore, the single layer substrate of a single crystal diamond used as the underlying substrate 11 can be any of a high-pressure-high-temperature-synthesized single crystal diamond, a heteroepitaxial single crystal diamond, a CVD-synthesized homoepitaxial diamond, and a combined single crystal diamond thereof. These single crystal diamonds can be suitably adopted as the underlying substrate 11 of the present invention.

Alternatively, in the inventive method for manufacturing a diamond substrate, the underlying substrate can have a laminated structure including an underlayer substrate and an intermediate layer on the underlayer substrate. FIG. 2 shows a diamond substrate 200 having an NVC-containing diamond layer formed on an underlying substrate having a laminated structure. That is, the diamond substrate 200 in FIG. 2 is a diamond substrate 200 using, as an underlying substrate 21, an underlying substrate having a laminated structure including an underlayer substrate 13 and an intermediate layer 14, and having an NVC-containing diamond layer 15 formed on the underlying substrate 21.

The intermediate layer 14 may be a single layer or a laminated body of a plurality of layers. The outermost surface of the intermediate layer 14 is preferably a metal layer selected from Ir, Rh, Pd, and Pt. When such a metal film is used, diamond nuclei tend to have high density when a nucleation treatment (bias treatment) is performed, and the single crystal diamond layer is more easily formed thereon, and therefore, it is preferable to use such a metal film.

Furthermore, in this case, the underlayer substrate 13 can be a substrate consisting of a single body of Si, MgO, $Al_2O_3$, $SiO_2$, $Si_3N_4$, or SiC, or a laminated body including a plurality of layers selected from Si, MgO, $Al_2O_3$, $SiO_2$, $Si_3N_4$, or SiC. When these materials are used for the underlayer substrate 13, it is easy to set the crystal plane orientation (including the off angle) of the main surface of the underlying substrate 21 along with the intermediate layer 14, and therefore, the materials are preferable as materials for the underlayer substrate 13 of the underlying substrate 21. Moreover, these materials are relatively low-cost, and can be procured easily.

Furthermore, the underlayer substrate 13 can be Si (111) or a Si (111) layer can be further included between the underlayer substrate 13 and the intermediate layer 14. When such an underlayer substrate 13 made of Si (111) or an underlying substrate 21 having a Si (111) layer is used, an epitaxial growth, advantageous for enlarging the area of a diamond substrate 200, for example, a substrate with a diameter of 4 inches (100 mm) or more, is possible.

Furthermore, the Si (111) of the underlayer substrate 13 or the Si (111) layer between the underlayer substrate and the intermediate layer in this case preferably has a main surface having an off angle within a range, −8.0° or more and −0.5° or less, or +0.5° or more and +8.0° or less in a crystal axis [−1−1 2] direction or a threefold symmetry direction thereof relative to a crystal plane orientation of (111). When such an underlayer substrate 13 made of Si (111) or an underlying substrate 21 having a Si (111) layer is used, step-flow growth can be easily performed, and a high-quality single crystal diamond crystal with few hillocks, abnormal growth particles, and dislocation defects, etc. can be formed. If the off angle exceeds −0.5°, or is less than +0.5°, it is difficult to perform a growth in a step direction, and therefore, a favorable crystal cannot be obtained. Meanwhile, if the off angle is less than −8.0°, or exceeds +8.0°, polycrystallization takes place if grown for a long time, and therefore, a good quality single crystal cannot be obtained.

Furthermore, as shown in FIG. 2, when an underlying substrate 21 having a laminated structure is used, the underlayer substrate 13 can be MgO (111) or a MgO (111) layer can be further included between the underlayer substrate 13 and the intermediate layer 14. When such an underlayer substrate 13 made of MgO (111) or an underlying substrate 21 having a MgO (111) layer is used, an epitaxial growth, advantageous for enlarging the area of the diamond substrate 200, for example, a substrate with a diameter of 4 inches (100 mm) or more, is possible. In addition, such MgO (111) has a lattice constant close to that of a diamond, and therefore, epitaxial growth of a high-quality diamond crystal becomes possible.

Furthermore, the MgO (111) of the underlayer substrate 13 or the MgO (111) layer between the underlayer substrate 13 and the intermediate layer 14 in this case preferably has a main surface having an off angle within a range, −8.0° or more and −0.5° or less, or +0.5° or more and +8.0° or less in a crystal axis [−1−1 2] direction or a threefold symmetry direction thereof relative to a crystal plane orientation of (111). When such an underlayer substrate 13 made of MgO (111) or an underlying substrate 21 having a MgO (111) layer is used, step-flow growth can be easily performed, and a high-quality single crystal diamond crystal with few hillocks, abnormal growth particles, and dislocation defects, etc. can be formed. When the off angle is −0.5° or less, or is +0.5° or more, growth in a step direction is easily performed, and therefore, a favorable crystal can be easily obtained. In addition, when the off angle is −8.0° or more, or is +8.0° or less, polycrystallization does not easily occur even when growth is performed for a long time, and a good quality single crystal can be easily obtained.

Furthermore, in the inventive method for manufacturing a diamond substrate, a member containing Si is preferably not used in a chamber for performing the formation of the diamond crystal by the CVD method. In a common CVD apparatus for manufacturing a diamond in a conventional manner, stainless steel is used for the inner wall of the chamber, stainless steel and molybdenum for stages, $Si_3N_4$, SiC, $Al_2O_3$, BN, etc. for insulators, and $SiO_2$ for the observation window. If a diamond is manufactured using a common CVD apparatus as described, Si is mixed in the diamond crystal, forming silicon-vacancy centers (SiVCs), and this becomes a source of noise when the diamond substrate is used for electronic and magnetic sensors. Accordingly, in the present invention, it is preferable not to use a member containing Si as members (inner wall of the chamber, stages, observation window, etc.) of the chamber for performing the formation of the diamond crystal by each CVD method.

In particular, the observation window of the chamber in a CVD apparatus is considered to be a source of Si that gets mixed in. Accordingly, sapphire is preferably used for the observation window of the chamber.

Furthermore, in the present invention, the underlying substrate can be removed from a diamond substrate including the diamond crystal layer having the NVCs obtained by the method for manufacturing a diamond substrate. In this manner, a freestanding single crystal diamond substrate including the diamond crystal layer having the NVCs can be obtained. Thus, a diamond substrate having an increased ratio of an NVC-containing portion allows reduction of the cause of noise in practical usage, and therefore, high-sensitivity electronic and magnetic devices can be realized. Note that when the underlying substrate is a single layer, the entire underlying substrate can be removed. Meanwhile, when the underlying substrate includes an underlayer substrate and an intermediate layer, the underlayer substrate alone may be removed, or both the underlayer substrate and the intermediate layer may be removed. Furthermore, a part of the underlying substrate may be removed.

FIG. 3 shows a diamond substrate 300 in a case where a nitrogen-undoped diamond layer 16 (made of a single crystal) and an NVC-containing diamond layer 15 (made of a single crystal) is further formed in this order on the underlying substrate 21 having the laminated structure. FIG. 4 shows a case where the underlying substrate 21 portion (underlayer substrate 13 and intermediate layer 14) has been removed from the diamond substrate 300 of FIG. 3 to obtain a diamond substrate 400 (a freestanding structure substrate of a diamond substrate) including an NVC-containing diamond layer 15 and a nitrogen-undoped diamond layer 16.

The method for removing the underlying substrates 11 and 21 is not particularly limited. A mechanical treatment such as polishing or a wet or dry etching treatment etc. may be appropriately selected according to the materials of the underlying substrates 11 and 21, underlayer substrate 13, and intermediate layer 14. The above treatments may also be combined.

In addition, a step of smoothing the surface of the NVC-containing diamond crystal layer can be included. For smoothing, mechanical polishing, chemical-mechanical polishing, plasma treatment, sputtering treatment, and chemical etching, etc. can be favorably performed. When the average surface roughness Ra of the surface of the NVC-containing diamond crystal layer is 270 nm or less, irregular reflection of light is suppressed, and the NV$^-$ center light that can be obtained can be increased.

The following diamond substrate can be obtained by the inventive method for manufacturing a diamond substrate described above. That is, a diamond substrate including a diamond crystal layer having NVCs, where a light intensity $I_{NV^-}$ of an NV$^-$ center light (wavelength: 637 nm) is $I_{NV^-} \geq 2800$ counts when the diamond crystal layer having the NVCs is measured by a photoluminescence apparatus under conditions: an excitation light wavelength of 532 nm; an excitation light intensity of 2.0 mW; a total time of 1 second; a total number of 3 times; a hole diameter of 100 μm; an objective lens with a magnification of 15; and measurement in room temperature of 298 K. The photoluminescence apparatus used in the measurement can be LabRAM-HR PL manufactured by HORIBA, Ltd.

Such a diamond substrate has high crystallinity and highly dense NVCs with a high [111] orientation of NV axis. In addition, for this reason, the diamond substrate can be applied to electronic and magnetic devices.

In this event, a ratio $I_{NV^-}/I_{Raman}$ of a light intensity $I_{NV^-}$ of an NV$^-$ center light (wavelength: 637 nm) and a light intensity IRaman of a Raman scattered light (wavelength: 573 nm) is preferably $I_{NV^-}/I_{Raman} \geq 0.04$ when the diamond crystal layer having the NVCs is measured by the photoluminescence apparatus under conditions: an excitation light wavelength of 532 nm; an excitation light intensity of 2.0 mW; a total time of 1 second; a total number of 3 times; a hole diameter of 100 μm; an objective lens with a magnification of 15; and measurement in room temperature of 298 K.

Furthermore, a nitrogen concentration [N] in the diamond crystal layer having the NVCs is preferably $5 \times 10^{17}$ atoms/cm$^3 \leq $[N]$\leq 9 \times 10^{19}$ atoms/cm$^3$.

When the diamond substrate has such physical properties, the diamond substrate can have an NVC-containing diamond crystal with more favorable characteristics.

Furthermore, as described above, the average surface roughness Ra of the surface of the NVC-containing diamond crystal layer is preferably 270 nm or less, since irregular reflection of light can be suppressed, and the NV center light that can be obtained can be increased.

EXAMPLE

Hereinafter, the present invention will be described in detail with reference to Examples, but the present invention is not limited thereto.

Example 1

As an underlying substrate, a single crystal MgO substrate polished on one side having a diameter of 20.0 mm, a thickness of 1.0 mm, a main surface that is a (111) surface, and an off angle of 2° in a crystal axis [−1−1 2] direction (hereinafter referred to as "single crystal MgO (111) substrate") was prepared.

Next, an intermediate layer of a single crystal Ir film was formed by R. F. magnetron sputtering method on the surface of the prepared single crystal MgO (111) substrate. The single crystal Ir film was formed by a radio-frequency (RF) magnetron sputtering method (13.56 MHz) with targeting at Ir having a diameter of 6 inches (150 mm), a thickness of 5.0 mm, and purity of 99.9% or more.

The single crystal MgO (111) substrate, being an underlayer substrate was heated to 800° C., and after it was confirmed that the base pressure had become $6 \times 10^{-7}$ Torr (about $8.0 \times 10^{-3}$ Pa) or lower, 50 sccm of Ar gas was introduced. Next, after making the pressure $3 \times 10^{-1}$ Torr (about 39.9 Pa) by adjusting the aperture of the valve connected to the exhaust system, film formation was performed for 15 minutes by inputting RF power of 1000 W. In this manner, a single crystal Ir film with a thickness of 1.0 μm was obtained.

A single crystal MgO (111) substrate on which a single crystal Ir film was laminated in the manner described above grew heteroepitaxially in accordance with the off angle of the single crystal MgO substrate. This single crystal Ir film was analyzed by an X-ray diffraction method with a wavelength of λ=1.54 Å, and the surface was a (111) surface and there was an off angle of 2° in the crystal axis [−1−1 2] direction. In addition, the half width (FWHM) of the diffracted peak at 2θ=40.7°, assigned to Ir (111) was 0.187°. Hereinafter, this single crystal Ir film will be referred to as "Ir (111) film".

Next, as pre-treatment for forming diamond nuclei, a nucleation treatment (bias treatment) was performed. The substrate was set on a planar electrode with a diameter of 25 mm inside a treatment chamber with the Ir (111) film side facing upwards. After it was confirmed that the base pressure had become $1 \times 10^{-6}$ Torr (about $1.3 \times 10^{-4}$ Pa) or lower, hydrogen-diluted methane gas (CH$_4$/(CH$_4$+H$_2$))=5.0 volume %) was introduced into the treatment chamber at a flow rate of 500 sccm. After making the pressure 100 Torr (about $1.3 \times 10^4$ Pa) by adjusting the aperture of the valve connected to the exhaust system, a negative voltage was applied to the electrode at the substrate side to expose to plasma for 90 seconds, and thereby the substrate (Ir (111) film) surface was subjected to bias treatment.

Diamond was heteroepitaxially grown on the Ir (111) film/single crystal MgO (111) substrate produced as described above by a direct current plasma CVD method. The Ir (111) film/single crystal MgO (111) substrate subjected to bias treatment was set inside the chamber of a direct current plasma CVD apparatus. After it was confirmed that the base pressure had become $1\times10^{-6}$ Torr (about $1.3\times10^{-4}$ Pa) or lower, a mixed gas of a methane gas and a hydrogen gas, the mixed gas being a raw material, was introduced into the chamber at a flow rate of 200 sccm at the following volume ratio:

| | |
|---|---|
| methane gas | 5.000 volume %; and |
| hydrogen gas | 95.000 volume %. |

After making the pressure inside the chamber 110 Torr (about $1.5\times10^4$ Pa) by adjusting the aperture of the valve connected to the exhaust system, film formation was performed for 20 hours by applying a direct discharge current of 6.0 A, whereby the film formation was performed until the thickness reached about 130 µm.

Subsequently, a mixed gas of a methane gas and a hydrogen gas, with nitrogen gas further added, the mixed gas being a raw material, was introduced into the chamber at a flow rate of 200 sccm with the volume ratio changed to:

| | |
|---|---|
| methane gas | 2.000 volume %; |
| hydrogen gas | 97.995 volume %; and |
| nitrogen gas | $5.0 \times 10^{-3}$ volume %. |

The pressure and the discharge current stayed the same. The film formation was performed until the thickness of the nitrogen-doped layer reached about 20 µm by performing the film formation under these conditions for 6 hours.

In this manner, diamond layers were heteroepitaxially grown on the Ir (111) film/single crystal MgO (111) substrate, and a laminate substrate was obtained.

Subsequently, the Ir (111) film/single crystal MgO (111) substrate was removed to make a freestanding substrate. Firstly, after removing the single crystal MgO (111) substrate by etching, the Ir (111) film was removed by polishing. As a result, a single crystal diamond (111) laminate substrate having a diameter of 20 mm and being made of a nitrogen-doped single crystal diamond film of about 20 µm and an undoped single crystal diamond (111) substrate about 130 µm thick was obtained.

The surface side of the diamond substrate having the laminated structure was polished for completion.

Lastly, the completed laminate substrate was analyzed by SIMS, XRD, PL, and surface roughness.

The nitrogen concentration [N] in the crystal was measured with a secondary ion mass spectrometry (SIMS) apparatus (IMS-7f manufactured by CAMECA). As a result, the nitrogen concentration [N] at a depth of about 10 µm from the outermost surface of the film was:
[N]=$8\times10^{18}$ atoms/cm³.

Crystallinity was measured from the outermost surface of the film with an X-ray diffraction (XRD) apparatus (SmartLab manufactured by Rigaku Corporation). As a result, only a diffracted intensity peak at 2θ=43.9°, assigned to diamond (111) was observed. Thus, it was confirmed that the nitrogen-doped single crystal diamond film had epitaxially grown on the undoped single crystal diamond (111) layer.

Furthermore, a photoluminescence (PL) apparatus (LabRAM-HR PL manufactured by HORIBA, Ltd.) was used for measurement under conditions: an excitation light wavelength of 532 nm; an excitation light intensity of 2.0 mW; a total time of 1 second; a total number of 3 times; a hole diameter of 100 µm; an objective lens with a magnification of 15; and measurement in room temperature (298 K). As a result, the light intensity $I_{NV-}$ of an NV center light (wavelength: 637 nm) was:
$I_{NV-}$=15090 (counts).

In addition, the ratio $I_{NV-}$/IRaman of $I_{NV-}$ and a light intensity IRaman of a Raman scattered light (wavelength: 573 nm) was:
$I_{NV-}$/IRaman=1.54.

Therefore, the obtained nitrogen-doped film was a single crystal diamond (111) crystal having NVCs formed with high density.

Note that when the surface of the diamond substrate was measured in a 290 µm×218 µm region using an optical surface roughness tester (New View 5032 manufactured by Zygo Corporation), the average surface roughness Ra was 147 nm.

If the NVC-containing diamond (111) substrate is applied to electronic and magnetic devices, a high-performance device can be obtained. For example, a high-sensitivity magnetic sensor can be obtained.

Example 2

As an underlying substrate, a single crystal diamond substrate polished on one side having a diameter of 20 mm, a thickness of 125 µm, a main surface that is (111), and an off angle of 2° in a crystal axis [−1-1 2] direction was prepared. The method for manufacturing this single crystal diamond substrate was as follows. Firstly, the same procedures as Example 1 were conducted until the formation of the nitrogen-undoped single crystal diamond layer to obtain a nitrogen-undoped single crystal diamond layer/Ir (111) film/single crystal MgO (111) substrate. Next, the Ir (111) film/single crystal MgO (111) substrate was removed to make a freestanding substrate. Specifically, after removing the single crystal MgO (111) substrate by etching, the Ir (111) film was removed by polishing. As a result, a freestanding nitrogen-undoped single crystal diamond (111) single layer substrate having a diameter of 20 mm and a thickness of about 130 µm was obtained. The surface side of the substrate was polished to obtain a single crystal diamond substrate to be an underlying substrate, polished on one side and having a diameter of 20 mm, a thickness of about 120 µm, a main surface that is (111), and an off angle of 2° in a crystal axis [−1-1 2] direction.

A nitrogen-doped single crystal diamond was epitaxially grown on the underlying substrate produced as described above by the direct current plasma CVD method. The underlying substrate was set inside the chamber of a direct current plasma CVD apparatus. After it was confirmed that the base pressure had become $1\times10^{-6}$ Torr (about $1.3\times10^{-4}$ Pa) or lower, a mixed gas of a methane gas and a hydrogen gas, with a nitrogen gas further added, the mixed gas being a raw material, was introduced into the chamber at a flow rate of 200 sccm at the following volume ratio:

| | |
|---|---|
| methane gas | 0.200 volume %; |
| hydrogen gas | 99.795 volume %; and |
| nitrogen gas | $5.0 \times 10^{-3}$ volume %. |

After making the pressure inside the chamber 110 Torr (about $1.5\times10^4$ Pa) by adjusting the aperture of the valve connected to the exhaust system, film formation was performed for 20 hours by applying a direct discharge current of 6.0 A, whereby the film formation was performed until the thickness of the nitrogen-doped single crystal diamond layer reached about 70 μm.

In this manner, a laminate diamond substrate of a nitrogen-doped single crystal diamond layer/undoped single crystal diamond (111) substrate was obtained.

Lastly, the completed laminate substrate was analyzed by SIMS, XRD, PL, and surface roughness.

The nitrogen concentration [N] in the crystal was measured with a secondary ion mass spectrometry (SIMS) apparatus (IMS-7f manufactured by CAMECA). As a result, the nitrogen concentration [N] at a depth of about 15 μm from the outermost surface of the film was:
[N]=8×10$^{18}$ atoms/cm$^3$.

Crystallinity was measured from the outermost surface of the film with an X-ray diffraction (XRD) apparatus (Smart-Lab manufactured by Rigaku Corporation). As a result, only a diffracted intensity peak at 2θ=43.9°, assigned to diamond (111) was observed. Thus, it was confirmed that the N-doped film had epitaxially grown on the undoped single crystal diamond (111) substrate.

Furthermore, a photoluminescence (PL) apparatus (LabRAM-HR PL manufactured by HORIBA, Ltd.) was used for measurement under conditions: an excitation light wavelength of 532 nm; an excitation light intensity of 2.0 mW; a total time of 1 second; a total number of 3 times; a hole diameter of 100 μm; an objective lens with a magnification of 15; and measurement in room temperature (298 K). As a result, the light intensity $I_{NV^-}$ of an NV$^-$ center light (wavelength: 637 nm) was:
$I_{NV^-}$=341213 (counts).

In addition, the ratio $I_{NV^-}$/IRaman of $I_{NV^-}$ and a light intensity IRaman of a Raman scattered light (wavelength: 573 nm) was:
$I_{NV^-}$/IRaman=4.35.

Therefore, the obtained nitrogen-doped film was a single crystal diamond (111) crystal having NVCs formed with high density.

Note that when the surface of the diamond substrate was measured in a 290 μm×218 μm region using an optical surface roughness tester (New View 5032 manufactured by Zygo Corporation), the average surface roughness Ra was 261 nm.

If the NVC-containing diamond (111) substrate is applied to electronic and magnetic devices, a high-performance device can be obtained. For example, a high-sensitivity magnetic sensor can be obtained.

Example 3

A nitrogen-doped single crystal diamond was epitaxially grown in the following manner by the direct current plasma CVD method on an underlying substrate, produced in the same manner as in Example 2, made of an undoped single crystal diamond polished on one side having a diameter of 20 mm, a thickness of about 120 μm, a main surface that is (111), and an off angle of 2° in a crystal axis [−1−1 2] direction.

Firstly, the underlying substrate was set inside the chamber of a direct current plasma CVD apparatus. After it was confirmed that the base pressure had become 1×10$^{-6}$ Torr (about 1.3×10$^{-4}$ Pa) or lower, a mixed gas of an acetylene ($C_2H_2$) gas and a hydrogen gas, with an ammonia ($NH_3$) gas further added, the mixed gas being a raw material, was introduced into the chamber at a flow rate of 200 sccm with the volume ratio changed to:

| | |
|---|---|
| acetylene gas | 0.500 volume %; |
| hydrogen gas | 99.485 volume %; and |
| ammonia gas | 1.5 × 10$^{-2}$ volume %. |

After making the pressure inside the chamber 110 Torr (about 1.5×10$^4$ Pa) by adjusting the aperture of the valve connected to the exhaust system, film formation was performed for 5 hours by applying a direct discharge current of 6.0 A, whereby the film formation was performed until the thickness of the nitrogen-doped layer reached about 20 μm.

In this manner, a single crystal diamond (111) laminate substrate having a diameter of 20 mm and being made of a nitrogen-doped single crystal diamond film of about 20 μm and an undoped single crystal diamond (111) substrate about 120 μm thick was obtained.

The surface side of the diamond substrate having the laminated structure was polished for completion.

Lastly, the completed laminate substrate was analyzed by SIMS, XRD, PL, and surface roughness.

The nitrogen concentration [N] in the crystal was measured with a secondary ion mass spectrometry (SIMS) apparatus (IMS-7f manufactured by CAMECA). As a result, the nitrogen concentration [N] at a depth of about 10 μm from the outermost surface of the film was:
[N]=1×10$^{19}$ atoms/cm$^3$.

Crystallinity was measured from the outermost surface of the film with an X-ray diffraction (XRD) apparatus (Smart-Lab manufactured by Rigaku Corporation). As a result, only a diffracted intensity peak at 2θ=43.9°, assigned to diamond (111) was observed. Thus, it was confirmed that the nitrogen-doped single crystal diamond film had epitaxially grown on the undoped single crystal diamond (111) layer.

Furthermore, a photoluminescence (PL) apparatus (LabRAM-HR PL manufactured by HORIBA, Ltd.) was used for measurement under conditions: an excitation light wavelength of 532 nm; an excitation light intensity of 2.0 mW; a total time of 1 second; a total number of 3 times; a hole diameter of 100 μm; an objective lens with a magnification of 15; and measurement in room temperature (298 K). As a result, the light intensity $I_{NV^-}$ of an NV center light (wavelength: 637 nm) was:
$I_{NV^-}$=84290 (counts).

In addition, the ratio $I_{NV^-}$/IRaman of $I_{NV^-}$ and a light intensity IRaman of a Raman scattered light (wavelength: 573 nm) was:
$I_{NV^-}$/IRaman=2.93.

Therefore, the obtained nitrogen-doped film was a single crystal diamond (111) crystal having NVCs formed with high density.

Note that when the surface of the diamond substrate was measured in a 290 μm×218 μm region using an optical surface roughness tester (New View 5032 manufactured by Zygo Corporation), the average surface roughness Ra was 12 nm.

If the NVC-containing diamond (111) substrate is applied to electronic and magnetic devices, a high-performance device can be obtained. For example, a high-sensitivity magnetic sensor can be obtained.

Example 4

As an underlying substrate, a high-pressure-high-temperature-synthesized Ib type single crystal diamond substrate polished on one side having a 2.0 mm square shape, a thickness of 0.5 mm, a main surface that is a (111) surface, and an off angle of 2° in a crystal axis [−1−1 2] direction (hereinafter, referred to as "HPHT (111) substrate") was prepared.

Next, a diamond was epitaxially grown on the prepared HPHT (111) substrate by the direct current plasma CVD method. The substrate was set inside the chamber of a direct current plasma CVD apparatus. After it was confirmed that the base pressure had become $1\times10^{-6}$ Torr (about $1.3\times10^{-4}$ Pa) or lower, a mixed gas of a methane gas and a hydrogen gas, with a nitrogen gas further added, the mixed gas being a raw material, was introduced into the chamber at a flow rate of 200 sccm at the following volume ratio:

| | |
|---|---|
| methane gas | 0.005 volume %; |
| hydrogen gas | 99.995 volume %; and |
| nitrogen gas | $5.0 \times 10^{-5}$ volume %. |

After making the pressure inside the chamber 110 Torr (about $1.5\times10^4$ Pa) by adjusting the aperture of the valve connected to the exhaust system, film formation was performed for 20 hours by applying a direct discharge current of 6.0 A, whereby the film formation was performed until the thickness reached about 3 μm.

In this manner, a single crystal diamond (111) laminate substrate having a 2.0 mm square shape and being made of a nitrogen-doped single crystal diamond film of about 3 μm and an underlying HPHT (111) substrate about 0.5 mm thick was obtained.

Lastly, the completed laminate substrate was analyzed by SIMS, XRD, PL, and surface roughness.

The nitrogen concentration [N] in the crystal was measured with a secondary ion mass spectrometry (SIMS) apparatus (IMS-7f manufactured by CAMECA). As a result, the nitrogen concentration [N] at a depth of about 10 μm from the outermost surface of the film was:
[N]=$5\times10^{17}$ atoms/cm$^3$.

Crystallinity was measured from the outermost surface of the film with an X-ray diffraction (XRD) apparatus (Smart-Lab manufactured by Rigaku Corporation). As a result, only a diffracted intensity peak at 2θ=43.9°, assigned to diamond (111) was observed. Thus, it was confirmed that the nitrogen-doped single crystal diamond film had epitaxially grown on the undoped single crystal diamond (111) layer.

Furthermore, a photoluminescence (PL) apparatus (LabRAM-HR PL manufactured by HORIBA, Ltd.) was used for measurement under conditions: an excitation light wavelength of 532 nm; an excitation light intensity of 2.0 mW; a total time of 1 second; a total number of 3 times; a hole diameter of 100 μm; an objective lens with a magnification of 15; and measurement in room temperature (298 K). As a result, the light intensity $I_{NV-}$ of an NV center light (wavelength: 637 nm) was:
$I_{NV-}$=2890 (counts).

In addition, the ratio $I_{NV-}$/IRaman of $I_{NV-}$ and a light intensity IRaman of a Raman scattered light (wavelength: 573 nm) was:
$I_{NV-}$/IRaman=0.05.

Therefore, the obtained nitrogen-doped film was a single crystal diamond (111) crystal having NVCs formed with high density.

Note that when the surface of the diamond substrate was measured in a 290 μm×218 μm region using an optical surface roughness tester (New View 5032 manufactured by Zygo Corporation), the average surface roughness Ra was 40 nm.

If the NVC-containing diamond (111) substrate is applied to electronic and magnetic devices, a high-performance device can be obtained. For example, a high-sensitivity magnetic sensor can be obtained.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. A diamond substrate comprising a diamond crystal layer having nitrogen-vacancy centers and no silicon-vacancy centers, wherein a light intensity $I_{NV-}$ of an NV$^-$ center light (wavelength: 637 nm) is $I_{NV-}$≥2800 counts when the diamond crystal layer having the nitrogen-vacancy centers and no silicon-vacancy centers is measured by a photoluminescence apparatus under conditions:
an excitation light wavelength of 532 nm;
an excitation light intensity of 2.0 mW;
a total time of 1 second; a total number of 3 times;
a hole diameter of 100 μm;
an objective lens with a magnification of 15; and
measurement in room temperature of 298 K.

2. The diamond substrate according to claim 1, wherein a ratio $I_{NV-}$/IRaman of a light intensity $I_{NV-}$ of an NV$^-$ center light (wavelength: 637 nm) and a light intensity IRaman of a Raman scattered light (wavelength: 573 nm) is $I_{NV-}$/IRaman≥0.04 when the diamond crystal layer having the nitrogen-vacancy centers and no silicon-vacancy centers is measured by the photoluminescence apparatus under conditions:
an excitation light wavelength of 532 nm;
an excitation light intensity of 2.0 mW;
a total time of 1 second;
a total number of 3 times;
a hole diameter of 100 μm;
an objective lens with a magnification of 15; and
measurement in room temperature of 298 K.

3. The diamond substrate according to claim 1, wherein a nitrogen concentration [N] in the diamond crystal layer having the nitrogen-vacancy centers and no silicon-vacancy centers is $5\times10^{17}$ atoms/cm$^3$≤[N]≤$9\times10^{19}$ atoms/cm$^3$.

4. The diamond substrate according to claim 1, wherein an average surface roughness Ra of a surface of the diamond crystal layer having the nitrogen-vacancy centers and no silicon-vacancy centers is Ra≤270 nm.

* * * * *